United States Patent [19]
Wincn

[11] Patent Number: 5,418,820
[45] Date of Patent: May 23, 1995

[54] AUTOMATIC POLARITY DETECTION AND CORRECTION METHOD AND APPARATUS EMPLOYING LINKPULSES

[75] Inventor: John M. Wincn, Cupertino, Calif.

[73] Assignee: Advanced Micro Devices, Inc., Sunnyvale, Calif.

[21] Appl. No.: 863,991

[22] Filed: Apr. 6, 1992

Related U.S. Application Data

[63] Continuation-in-part of Ser. No. 620,980, Nov. 30, 1990, Pat. No. 5,257,287, which is a continuation-in-part of Ser. No. 480,426, Feb. 15, 1990, Pat. No. 5,164,960.

[51] Int. Cl.⁶ .................. H04L 27/06; H04B 1/10
[52] U.S. Cl. ............................ 375/340; 375/342; 375/351; 327/14; 327/28
[58] Field of Search ............ 375/104, 94, 17, 95; 455/218; 328/108, 109, 110; 307/231, 510, 514; 340/825.57, 825.65

[56] References Cited

U.S. PATENT DOCUMENTS

| | | | |
|---|---|---|---|
| 3,889,235 | 6/1975 | Assmus et al. | 371/67.1 |
| 4,012,589 | 3/1977 | Reisinger | 370/42 |
| 4,344,175 | 8/1982 | Leslie | 375/104 |

FOREIGN PATENT DOCUMENTS

| | | |
|---|---|---|
| 0316536 | 5/1989 | European Pat. Off. |
| 2537383 | 2/1977 | Germany |
| 3906927 | 9/1989 | Germany |

*Primary Examiner*—Stephen Chin
*Assistant Examiner*—Tesfaldet Bocure
*Attorney, Agent, or Firm*—Benman Collins & Sawyer

[57] ABSTRACT

An apparatus and method for a transition detector and pulse width qualifying circuit for a differential receiver. The circuit generates pulses at every transition of a differential input signal and asserts a time-out signal upon detection of an end-of-transmission delimiter pulse. The circuit also detects true or inverted linkpulses.

13 Claims, 6 Drawing Sheets

AUTOMATIC POLARITY DETECTION AND CORRECTION METHOD AND APPARATUS EMPLOYING LINKPULSES

This application is a continuation-in-part of application Ser. No. 7/620,980, filed Nov. 30, 1990, entitled "Improved Automatic Polarity Detection and Correction Method and Apparatus Employing Linkpulses," issued on Oct. 26, 1993, as U.S. Pat. No. 5,257,287, which is a continuation-in-part of application Ser. No. 7/480,426, filed Feb. 15, 1990, entitled "Twisted Pair Medium Access Unit," issued on Nov. 17, 1992, as U.S. Pat. No. 5,164,960, all hereby incorporated by reference for all purposes.

BACKGROUND OF THE INVENTION

Figure 1:
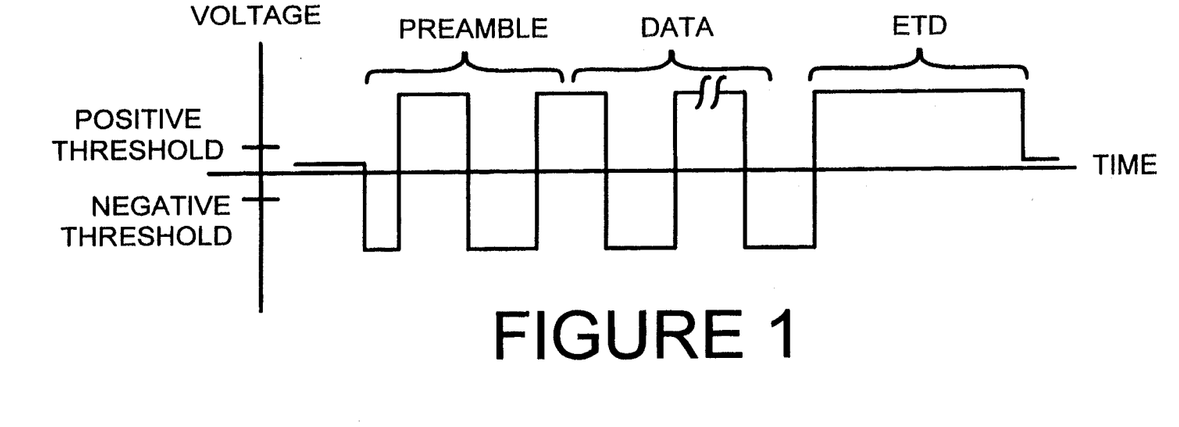
FIG. 1 illustrates one example of a packet having a preamble portion, a data portion and an end-of-transmission delimiter (ETD) portion.

The present invention relates to an apparatus and method for a transition detector and pulse width qualifying circuit for a differential receiver. The incorporated U.S. patent application Ser. No. 7/480,426 provides for one embodiment of a transition detector and pulse width qualifying circuit. That patent application discloses a communications network comprised of Medium Attachment Units (MAUs) interconnected by a pair of twisted pair cables. The twisted pair cables transmit data packets and linkbeat pulses from one MAU to another according to the IEEE 802.3 10BASE-T standard, which is expressly incorporated by reference for all purposes. The standard requires that when one MAU is not transmitting a data packet to another MAU, it should periodically transmit linkpulses to the MAU to test the integrity of a link between the MAUs. FIG. 1 illustrates one example of one such packet having a preamble portion, a data portion and an end-of-transmission delimiter (ETD) portion, referred to as Manchester-encoded signal. The preamble portion is an alternating series of high and low transitions and the ETD is a high level for a specified minimum time duration.

Figure 2A:
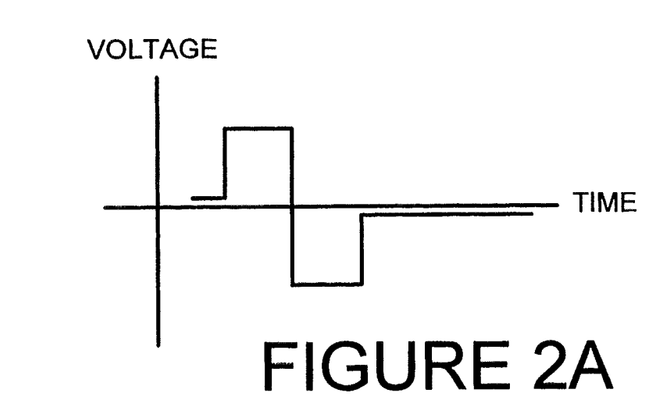
FIGS. 2a and 2b illustrate two acceptable linkpulse waveforms according to the IEEE standards.
Figure 2B:
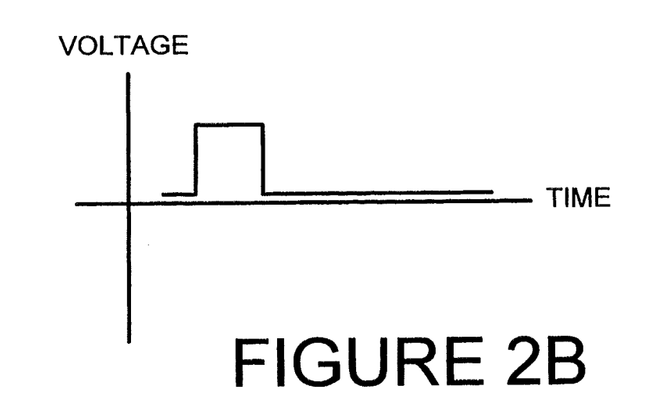

FIGS. 2a and 2b illustrate two acceptable linkpulse transmit waveforms according to the IEEE Specification. A linkpulse waveform is either a high transition or a high transition followed by a low transition fitting within a specified pulse template.

The U.S. patent application Ser. No. 7/480,426 further discloses a smart squelch circuit which is a noise rejection apparatus to ensure that only the receipt of a Manchester encoded signal by a particular MAU will activate circuits of that MAU to operate upon the input signal in a predetermined manner. The squelch circuit requires the necessary information about the characteristics of the signal at the receive input to properly distinguish between Manchester signals, linkbeat pulses, and noise. The present invention provides an improved apparatus for determining and providing the required information about the input signal characteristics.

SUMMARY OF THE INVENTION

The present invention discloses an apparatus and a method for detecting every transition on the receive signal so that a transition sequence checking circuit of a squelch circuit can detect a Manchester-encoded signal. The present invention also provides for an end-of-transmission delimiter (EDT) detection circuit to signal the end of a packet, as well as positive and negative linkpulse detectors.

Accordingly, in one embodiment, the present invention provides a differential signal receiver circuit for a squelch qualification circuit including a first positive edge detector responsive to a positive half of a differential signal, a second positive edge detector responsive to a negative half of the differential signal, logic means with two inputs coupled to the first and second positive edge detector outputs, for performing a logical sum of the detector output pulse signals, an end-of-transmission delimiter (ETD) detector with an input coupled to the logic means output, for detecting a predetermined time period of no transition on the differential input signal, and a linkpulse detector responsive to the logic means output and the first and second positive edge detector outputs, for detecting a negative or a positive linkpulse signal.

A further understanding of the nature and advantages of the present invention may be had with reference to the description and drawings below.

DESCRIPTION OF THE PREFERRED EMBODIMENT

Figure 3:
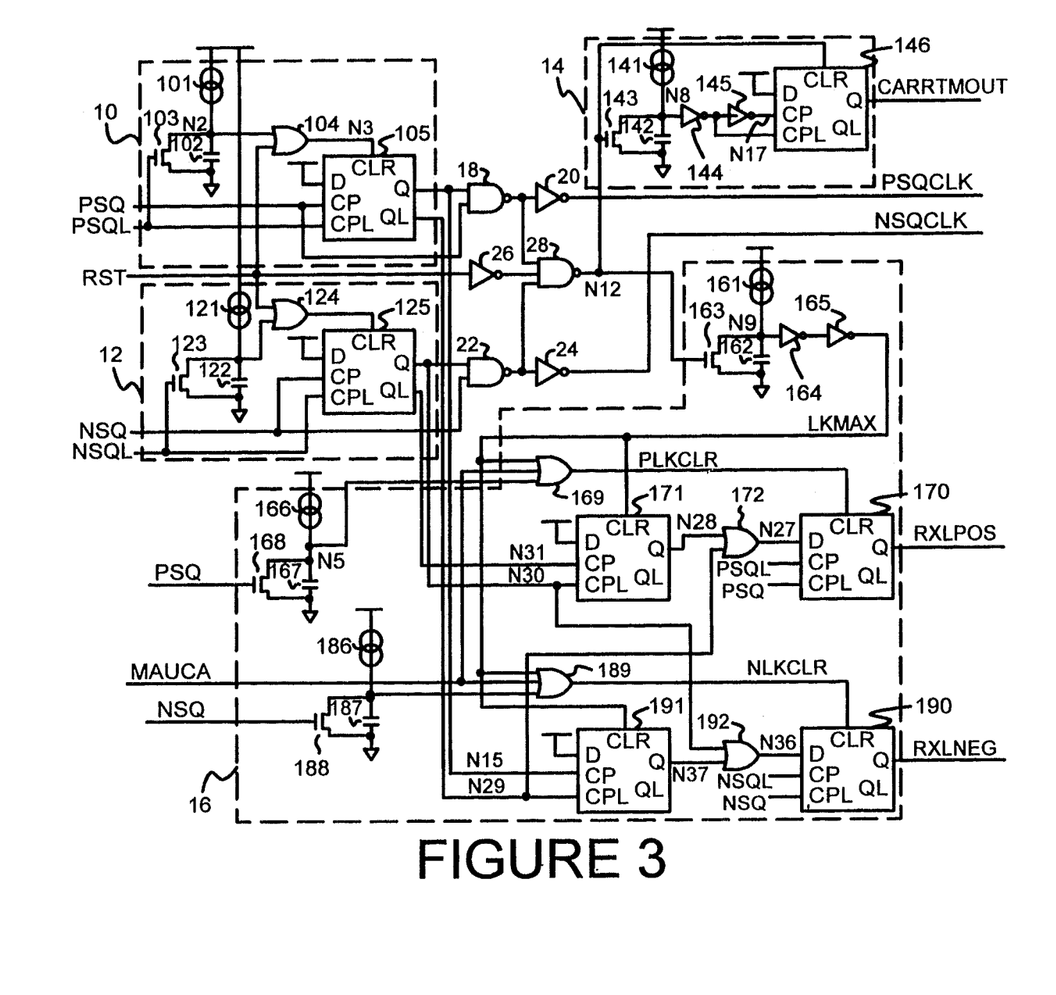
FIG. 3 is a circuit diagram of a preferred embodiment of the present invention.
Figure 4:
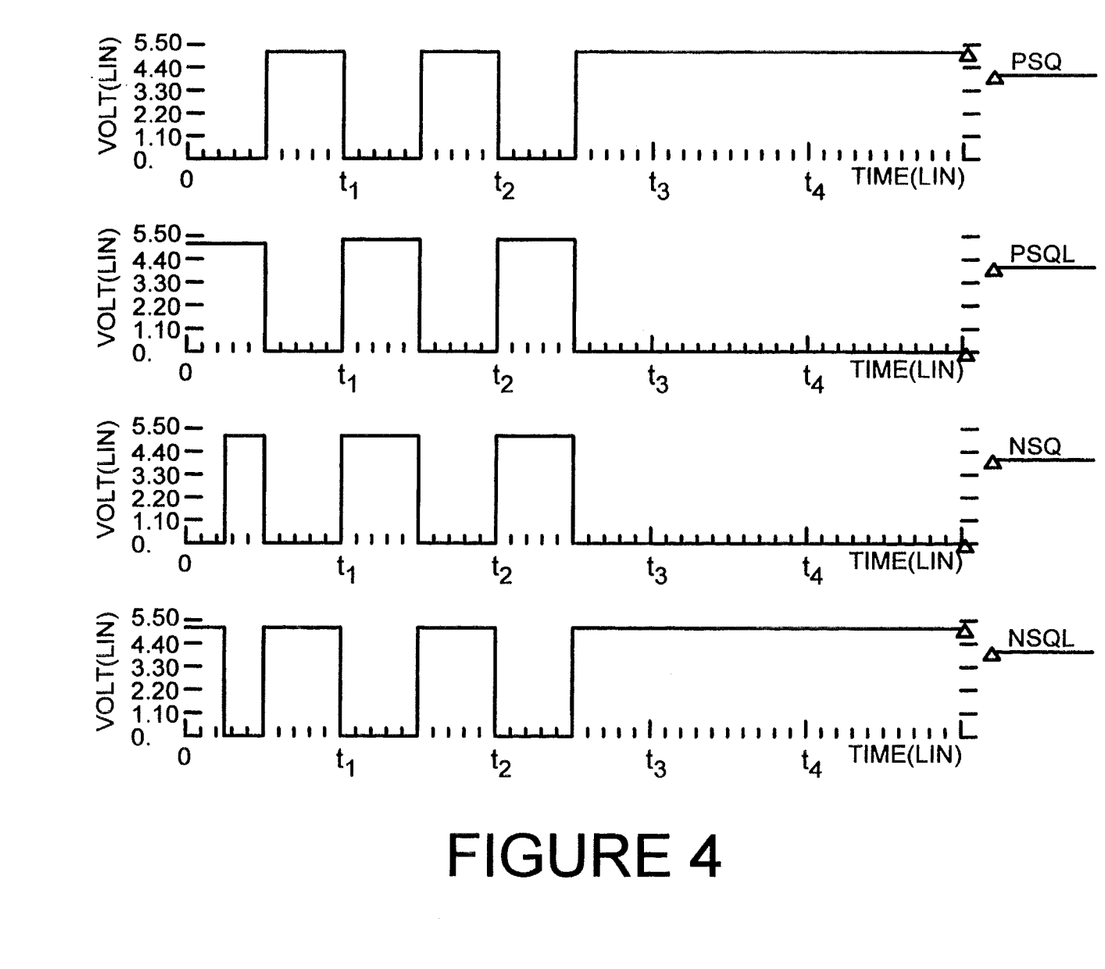
FIG. 4 illustrates amplitude qualified positive and negative halves of a differential input signal such as that depicted in FIG. 1.

FIG. 3 is a circuit diagram of a preferred embodiment of the present invention. This embodiment includes four basic functional blocks: a first leading edge detector 10 operating on a positive half cycle of a differential input signal PSQ, a second leading edge detector 12 operating on a negative half cycle of a differential input signal NSQ, an end-of-transmission delimiter (ETD) detector 14, and a positive and negative linkpulse detector 16. The input signals PSQ and NSQ are amplitude qualified differential signals representing a Manchester-encoded signal shown in FIG. 1. FIG. 4 shows the PSQ and NSQ signals and their logical inverses PSQL and NSQL respectively.

The first leading edge detector 10 is a one-shot circuit with a current source 101 connected to the top plate of a capacitor 102 for charging capacitor 102 to a logical high. The other plate of capacitor 102 connects to a ground terminal. A transistor 103 connects across the capacitor 102 to provide a discharge path for capacitor 102. The PSQL input signal drives the gate of the transistor 103. A two-input OR gate 104 has a first input connected to the top plate of capacitor 102, and a second input connected to a global reset input signal RST. The output of OR 104 drives the clear input CLR of a D-type flip-flop DFF 105. The D input of DFF 105 connects to a power supply terminal (logical high), and its clock inputs, CP and CPL, connect to PSQ and PSQL, respectively. The DFF flip-flop latches data from its D input to its Q output on a low-to-high transition of a clock signal at its clock input (CP).

Figure 5:
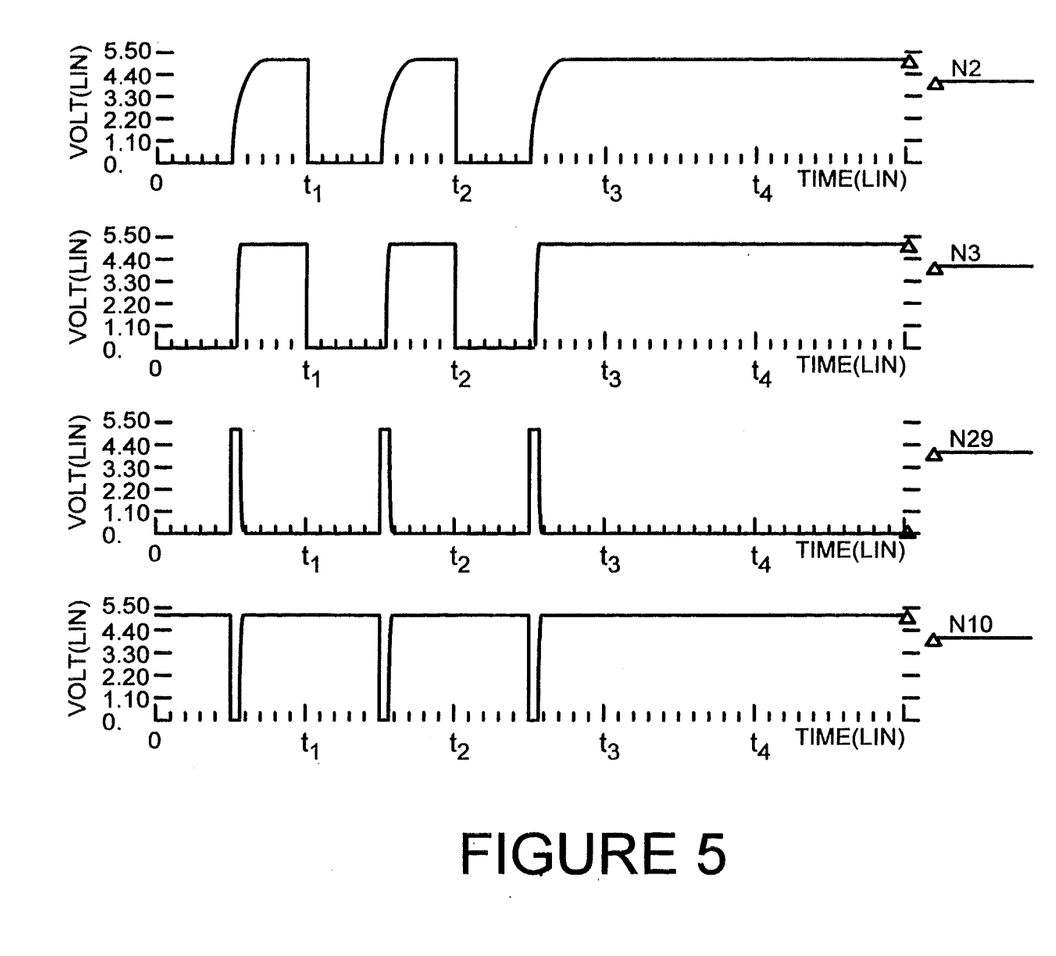
FIG. 5 is a waveform diagram illustrating the operation of a one-shot circuit implementing a leading edge detector of a positive half cycle of a differential signal.

FIG. 5 illustrates the operation of the one-shot circuit in a series of waveform diagrams. A logical high at the RST input resets the entire circuit by clearing all DFFs, including DFF 105, resulting in a logical low at its Q output, labeled as node N29. Once RST is removed (i.e., deasserted), the state of DFF 105 will not change until it is clocked by a rising edge of an input signal at PSQ. In the absence of an input signal (PSQ="0"), the PSQL input turns on transistor 103, shorting the top plate of capacitor 102, labeled node N2, to ground and discharges capacitor 102. Since the D input of DFF 105 is connected to a logical high, the first rising edge at PSQ clocks DFF 105 causing N29 to go high. However, at the same time, PSQL goes low turning off transistor 103, allowing current source 101 to begin charging capacitor 102. As soon as the voltage across capacitor 102 reaches the threshold for a logical high, the output of OR 104 (node N3) will be asserted high clearing DFF 105 (i.e., output N29 goes low). Therefore, node N29 is asserted high at every rising edge of PSQ and returns to a logical low a short period of time thereafter. The width of this pulse is controlled by the magnitude of current in the current source 101 and magnitude of capacitance of capacitor 102 and may be set, for example, to 15 nsec. This pulse is called the positive-half cycle pulse, since it corresponds to PSQ which is the positive half of the differential input. This positive-half cycle pulse at node N29 is ANDed with the PSQ input to generate the PSQCLK signal required by the smart squelch circuitry. This AND gate is made up of a NAND 18 followed by an inverter 20. Therefore, at every positive transition of PSQ, the PSQCLK signal delivers either a 15 nsec. pulse or a pulse whose width is precisely the same as that of the input signal PSQ when the input signal is less than 15 nsec.

The second leading edge detector 12 is a one-shot circuit identical to the first leading edge detector 10 described above. Instead of PSQ and PSQL, the inputs to this detector 12 are NSQ and NSQL which correspond to the negative half cycle of the differential input signal. Therefore, at every positive transition of NSQ, an NSQCLK signal delivers either a 15 nsec. pulse, or a pulse whose width is precisely the same as that of the input signal NSQ when the input signal is less than 15 nsec.

The EDT detector 14 is a timing circuit with a current source 141 connected to a top plate of a capacitor 142, labeled as node N8, for charging capacitor 142 up to a logical high. The other plate of capacitor 142 is connected to ground. A transistor 143 connects across capacitor 142 to provide a discharge path for capacitor 142, when its gate is asserted to a logical high. Node N8 is connected to an input of an inverter 144 whose output drives an input of a second inverter 145. The outputs of inverters 144 and 145 drive the clock inputs of a D-type flip-flop DFF 146, CP and CPL respectively. A D input of DFF 146 connects to the power supply (logical high).

The output terminal of NAND gate 18 at the output of detector 10, and the output terminal of NAND gate 22 at the output of detector 12, connect to two inputs of a 3-input NAND gate 28. The RST input is inverted by inverter 26 and connects as the third input of NAND 28. The output of NAND 28, labeled as node N12, is therefore a logical sum of the output pulses of both detectors 10 and 12. In other words, the signal at N12 is a series of pulses corresponding to every leading edge of both PSQ and NSQ inputs. The output of NAND 28 (node N12) connects to a gate of transistor 143, and a clear input of DFF 146. The Q output of DFF 146 is the CARRTMOUT signal indicating detection of an end-of-transmission delimiter when asserted.

FIG. 6 illustrates the operation of the ETD detector 14 by a series of waveform diagrams. A logical high at the RST input pulls node N12 high which clears DFF 146, deasserting CARRTMOUT. Once RST is removed, and in the absence of any input signal, node N12 is asserted low and DFF 146 is no longer cleared. With node N12 asserted low, transistor 143 is off allowing current source 141 to charge capacitor 142. Once node N8 (top plate of capacitor 142) crosses a threshold for a logical high, inverters 144 and 145 deliver a clock signal to DFF clock inputs asserting CARRTMOUT to a logical high. Therefore, with no input signal, CARRTMOUT is asserted high and remains high.

Figure 6A:
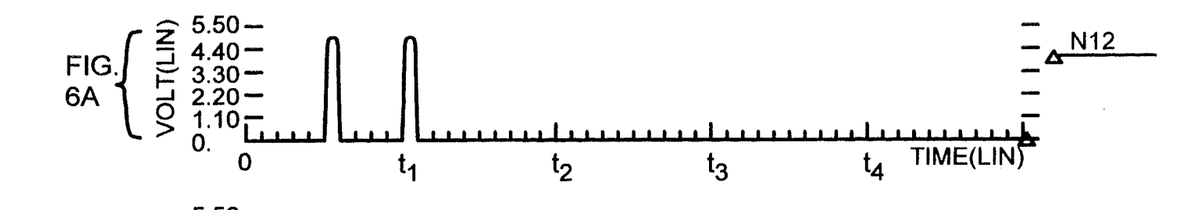
FIG. 6 is a waveform diagram illustrating the operation of a timing circuit implementing an end-of-transmission delimiter (ETD) detector.

When a data packet arrives at the receiver inputs, the logical sum of the one-shot outputs of leading edge detectors 10 and 12 at node N12 will be as shown in FIG. 6a. A first pulse at N12, indicating the first falling edge of the Manchester encoded signal, clears DFF 146 and deasserts CARRTMOUT. Before the second pulse arrives, current source 141 charges capacitor 142 causing node N8 to rise at a rate set by the magnitude of current in current source 141 and value of capacitance of capacitor 142. However, a second pulse corresponding to the first rising edge of the input signal, arrives to discharge capacitor 142 before N8 crosses the threshold for a logical high. Therefore DFF 146 will not be clocked, and CARRTMOUT remains low. This process continues and capacitor 142 at node N8 is never allowed to charge up to a logical high as long as the pulse repetition rate at N12 is fast enough.

Figure 6B:
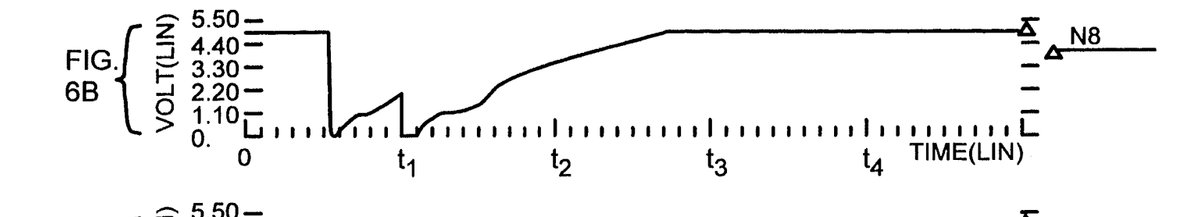
Figure 6C:
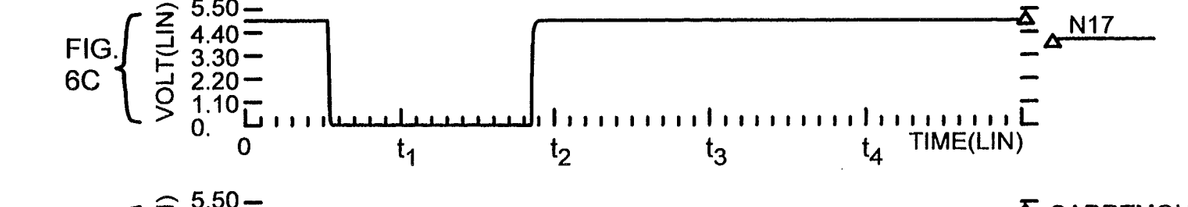
Figure 6D:
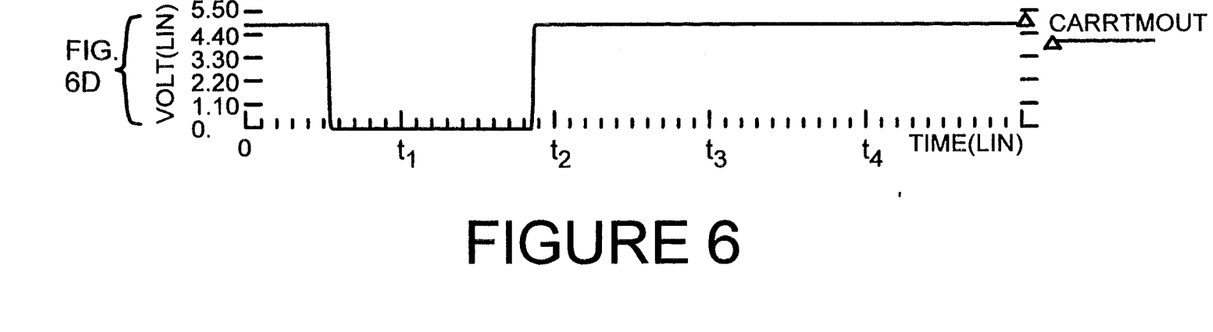

The ETD portion of the packet is a long period of logical high that follows the final rising edge of the data portion of the Manchester packet. During ETD, when there is no transition, node N12 remains low. This allows capacitor 142 to charge up and node N8 to reach the threshold for a logical high, for example, after 150 nsec. FIG. 6b shows the waveform at node N8. As soon as N8 reaches the logical high threshold, inverters 144 and 145 toggle, delivering a clock signal to DFF 146 clock inputs. The D input of DFF 146 is clocked to the output, asserting CARRTMOUT high, indicating the detection of an ETD.

The linkpulse detector 16 detects either a positive linkpulse as shown in FIG. 2, or an inverted or negative linkpulse in cases where the twisted pair leads are reversed in the receive signal path. Therefore, the linkpulse detector 16 includes a positive linkpulse detector responsive to the PSQ positive edge detector 10, and a negative linkpulse detector responsive to the NSQ positive edge detector 12.

The IEEE specifications require that a receiver detect a transmitted linkpulse with a pulse width between 60 nsec. and 200 nsec. By using the outputs of the 15 nsec. one-shot circuits of edge detectors 10 and 12 as inputs to the linkpulse detector 16, the minimum pulse width that can be detected as a linkpulse is set to 15 nsec. This guarantees proper detection of 60 nsec. pulses by providing a margin for variation.

A separate timing circuit is used to set the maximum pulse width to 200 nsec. plus a margin of, for example, 20 or 30 nsec. (i.e., total of 230 nsec.). This timing circuit includes a current source 161 connecting to a top plate of a capacitor 162 with a bottom plate connecting to ground. A transistor 163 connects across capacitor 162 to provide a discharge path. The top plate of capacitor 162, labeled as node N9 connects to an input of an inverter 164 whose output drives an input of a second inverter 165. The output of NAND 28 (node N12), which is a signal with a pulse for every leading edge transition of PSQ and NSQ at the input signal, drives the gate of transistor 163. Therefore, in the absence of any transitions at the input, N12 remains low, keeping transistor 163 turned off and allowing current source 161 to build charge on capacitor 162, raising the voltage at node N9. The magnitude of current source 161 and value of capacitor 162 are chosen such that if no transitions occur for a period of about 230 nsec., node N9 will reach the logic high threshold and assert the output of the second inverter 165, labeled as LKMAX, high. The signal at LKMAX clears the outputs RXLPOS and RXLNEG of the linkpulse detector 16, preventing it from indicating a pulse wider than the maximum limit as a valid linkpulse.

The positive linkpulse detector includes a timing circuit which sets a pulse width for the output of the detector. It is comprised of a current source 166 connected to the top plate of a capacitor 167 with the other plate connecting to ground. A transistor 168 connects across the capacitor 167 to provide a discharge path. The input signal PSQ drives the gate of transistor 168. The top plate of capacitor 167, labeled node N5, connects to one input of a 3-input OR gate 169. The signal LKMAX connects to a second input of OR 169, while the third is driven by an input signal MAUCA (MAU Carrier Active).

The input MAUCA signals the detection of a Manchester signal by the sequence detector of the squelch circuit that connects to the outputs of the transition detector circuit of the present invention. If the sequence of PSQCLK and NSQCLK outputs of the transition detector of the present invention correspond to a Manchester encoded signal, the squelch circuit asserts MAUCA, signaling the detection of a carrier. Linkpulse transmission ceases during Manchester activity, and MAUCA disables the linkpulse detector circuitry when asserted.

The output of OR 169 directly connects to a clear input of a D-type flip-flop DFF 170, whose output Q is the RXLPOS output of the positive linkpulse detector circuit. Therefore, MAUCA and LKMAX disable the detector by asserting the signal at the clear input of DFF 170. The PSQL and PSQ input signals drive DFF 170 clock inputs CP and CPL, respectively. Therefore, it is the falling edge of PSQ (rising edge of PSQL) that clocks the signal at the D input of DFF 170 to its Q output.

The positive linkpulse detector must detect either a single positive pulse, or a positive pulse followed by a negative pulse as shown in FIG. 2a and 2b. The negative linkpulse detector must detect the inverse of that shown in FIG. 2a and 2b. Therefore, to avoid faulty linkpulse detection, the circuit has been designed such that when a positive pulse appears at the input first, the positive detector responds and the negative detector is disabled, and when a negative pulse appears first, the negative detector responds while the positive detector is disabled. A D-type flip-flop DFF 171 and a 2-input NOR gate 172 achieve this function for the positive linkpulse detector. The inverse and true outputs of the one-shot circuit of NSQ positive edge detector 12, labeled as nodes N31 and N30, drive DFF 171 clock inputs CP and CPL respectively. The D input of DFF 171 connects to power supply (logical high), and the LKMAX signal drives the clear input of DFF 171. The Q output of DFF 171, labeled as node N28, drives one input of NOR gate 172, while the other input connects to the true output of the one-shot circuit of the PSQ positive edge detector 10 (node N29). The output of NOR 172, labeled as node N27, drives the D input of DFF 170.

Figure 7:
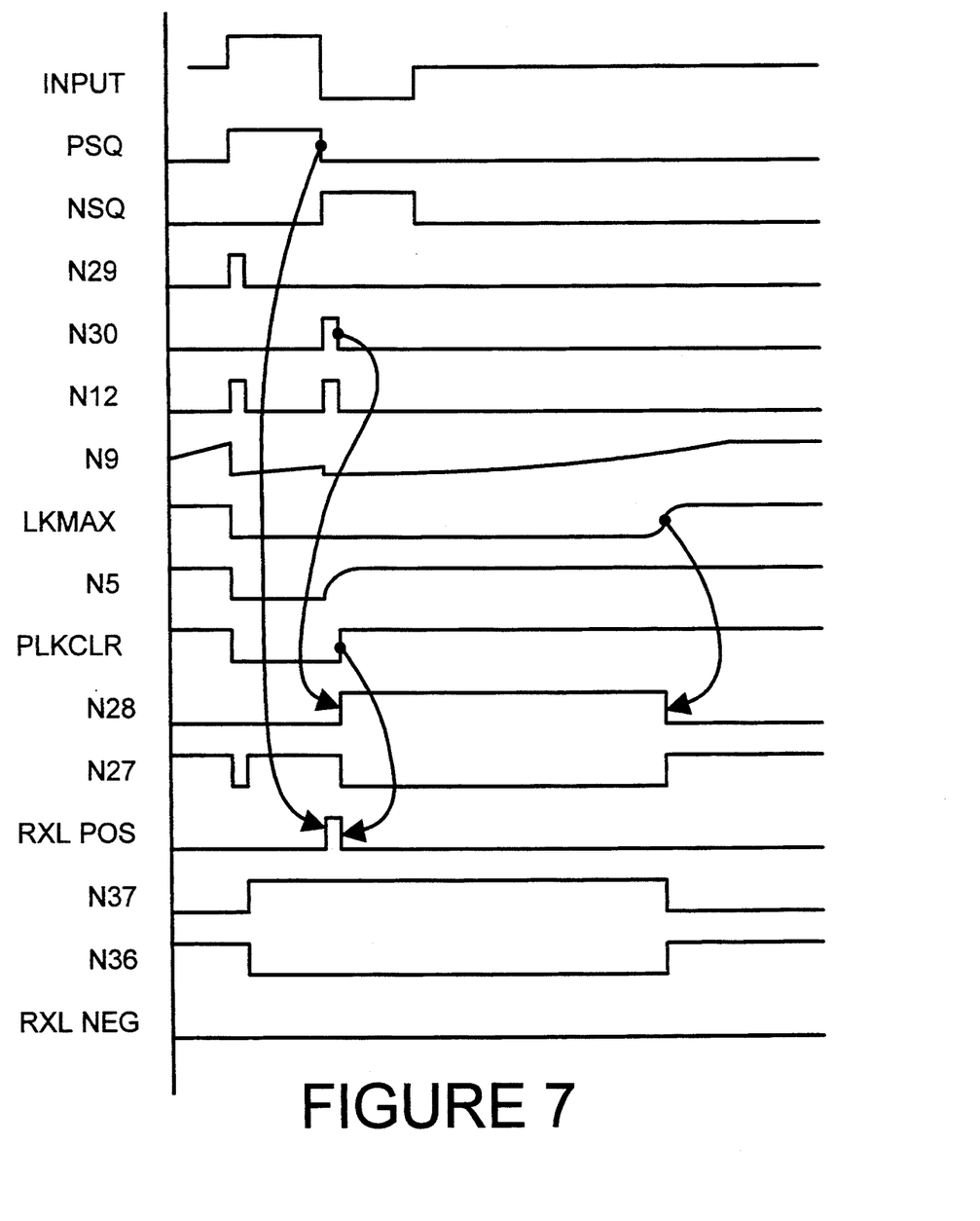
FIG. 7 is a waveform diagram illustrating the operation of a timing circuit implementing a positive linkpulse detector.

FIG. 7 illustrates the operation of the positive linkpulse detector in a series of waveform diagrams. The input signal is a linkpulse having a positive pulse followed by a negative pulse (FIG. 2a). This input places a single positive pulse at PSQ and a single positive pulse at NSQ. Therefore, there will be a 15 nsec. pulse at the output of the PSQ one-shot circuit (node N29) corresponding to the rising edge of PSQ, and a 15 nsec. pulse at the output of the NSQ one-shot circuit (node N30) corresponding to the rising edge of NSQ (which is the same as the falling edge of PSQ). With DFF 171 having been initially cleared by LKMAX, node N28 is initially at a logical low. Since node N29 stays at a logical low, except for a 15 nsec. pulse at the rising edge of PSQ, the output of NOR 27 starts high, goes low for only 15 nsec. corresponding to the signal on N29, and returns to and stays at a high until the rising edge of node N31 (inverse of node N30, which is a pulse at the falling edge of PSQ) clocks a high at the D input of DFF 171 to node N28. Therefore, node N27 goes low effectively 15 nsec. after the falling edge of PSQ. DFF 170 is clocked by PSQL, therefore, the falling edge of PSQ clocks the logical high at N27 (or the D input of DFF 170) to the output RXLPOS. DFF 170 is cleared (RXLPOS goes back to a logical low) by the PLKCLR signal generated by OR 169, 15 nsec. after it is asserted. This 15 nsec. positive pulse at RXLPOS indicates the detection of a positive linkpulse.

The negative linkpulse detector operates exactly the same as the positive linkpulse detector, except it detects inverted linkpulses as might occur when the RD circuit connection to the MAU receiver input is reversed. Therefore, given a linkpulse as in FIG. 2a, the negative linkpulse detector must be prevented from detecting the negative pulse as an inverted positive linkpulse. Referring to FIG. 3 and FIG. 7, the falling edge of node N29, which is a 15 nsec. pulse at the positive edge of PSQ, clocks a logical high at the input DFF 191 to its output node N37. This places a logical low at the output of NOR 192, which is a D input of DFF 190. Therefore, when NSQL comes along to clock DFF 190, the D input is low, causing no change at the output RXLNEG.

The LKMAX signal clears both DFF 171 and 170 approximately 230 nsec. after the last transition at the MAU RD receiver inputs.

In conclusion, the present invention provides a transition detector and pulse width qualifying circuit for a differential receiver. While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents.

What is claimed is:

1. A differential signal receiver circuit for a squelch qualification circuit comprising:
 a first leading edge detector with an input coupled to a first input signal corresponding to a positive half cycle of a differential signal, for generating at an output a positive-half pulse signal at a leading edge transition of said first input signal;
 a second leading edge detector with an input coupled to a second input signal corresponding to a negative half cycle of said differential signal, for generating at an output a negative-half pulse signal at a leading edge transition of said second input signal;
 logic means, having a first input coupled to said first leading edge detector output, and a second input coupled to said second leading edge detector output, for performing a logical sum of said positive-half and negative-half pulse signals to generate a sum signal at an output; and
 an end-of-transmission delimiter detector with an input coupled to said logic means output, for asserting a time-out signal when a predetermined time period of no transitions follows a series of transitions on said differential input signal, indicating an end of transmission.

2. The differential signal receiver of claim 1 wherein said first leading edge detector comprises a one-shot circuit including a delaying and gating network with two inputs receiving said first input signal and an inverse of said first input signal, for generating a pulse of controlled duration at leading edge transitions of said first input signal.

3. The differential signal receiver of claim 1 wherein said second leading edge detector comprises a one-shot circuit including a delaying and gating network with two inputs receiving said second input signal and an inverse of said second input signal, for generating a pulse of controlled duration at leading edge transitions of said second input signal.

4. The differential signal receiver of claim 1 wherein said end-of-transmission delimiter detector comprises a timing circuit with a predefined timing threshold having an input for receiving said logic means output sum signal, said timing circuit for measuring a time duration between asserted pulses of said sum signal and asserting a time-out output signal once said duration exceeds said timing threshold, indicating end of transmission.

5. A differential signal receiver circuit for a squelch qualification circuit comprising:
 a first leading edge detector with an input coupled to a first input signal corresponding to a positive half cycle of a differential signal, for generating at an output a positive-half pulse signal at a positive transition of said first input signal;
 a second leading edge detector with an input coupled to a second input signal corresponding to a negative half cycle of said differential signal, for generating at an output a negative-half pulse signal at a positive transition of said second input signal;
 logic means, having a first input coupled to said first leading edge detector output, and a second input coupled to said second leading edge detector output, for performing a logical sum of said positive-half and negative-half pulse signals to generate a sum signal at an output; and
 a linkpulse detector responsive to said logic means output and said first and second leading edge detector outputs, for detecting one of a negative and a positive linkpulse signals with a predetermined duration, and asserting one of a positive and negative linkpulse detect outputs respectively.

6. The differential input receiver of claim 5 wherein said linkpulse detector comprises:
 a positive linkpulse detector responsive to said positive half cycle of said differential input signal for detecting a positive linkpulse and asserting a positive linkpulse detect output;
 a negative linkpulse detector responsive to said negative half cycle of said differential input signal for detecting a negative linkpulse and asserting a negative linkpulse detect output;
 a timing circuit with a predefined timing threshold having an input for receiving said logic means output sum signal, said timing circuit for measuring a time duration between asserted pulses of said sum signal and disabling said positive and said negative linkpulse detect outputs once said duration exceeds said timing threshold; and
 wherein upon detection of a positive linkpulse said positive linkpulse detector disables said negative linkpulse detector, upon detection of a negative linkpulse said negative linkpulse detector disables said positive linkpulse detector, and upon detection of a carrier by the squelch qualification circuit, the squelch qualification circuit disables said linkpulse detectors.

7. The differential signal receiver of claim 5 wherein said linkpulse detector comprises:
 a first transistor switch with a control terminal coupled to said sum signal, a first terminal coupled to a first current source and a second terminal coupled to a ground terminal;
 a first charge storage element with a first terminal coupled to said transistor switch first terminal and said current source, and a second terminal coupled to said ground terminal;
 a buffer circuit including two series inverters, with an input coupled to said charge storage element first terminal and an output for indicating no-link upon assertion;
 a first D-type flip-flop with a D input coupled to a logic high from a power supply, a clear input coupled to said buffer circuit output, a clock input coupled to said second leading edge detector output, and an output;
 a first two-input NOR gate with a first input coupled to said first flip-flop output, a second input coupled to said first leading edge detector output, and an output;
 a second transistor switch with a control terminal coupled to said first input signal, a first terminal coupled to a second current source and a second terminal coupled to said ground terminal;
 a second charge storage element with a first terminal coupled to said second transistor switch first terminal and a second current source, and a second terminal coupled to said ground terminal;
 a first three-input OR gate with a first input coupled to said buffer circuit output, a second input coupled to one output of the squelch qualification circuit, a third input coupled to said second charge storage element first terminal, and an output;

a second D-type flip-flop with a D input coupled to said first two-input NOR gate output, and a clear input coupled to said three-input OR gate output, a clock input coupled to an inverse of said first input signal, and an output indicating a detection of a positive linkpulse upon assertion;

a third D-type flip-flop with a D input coupled to a logical high from a power supply, a clear input coupled to said buffer circuit output, a clock input coupled to said first leading edge detector output, and an output;

a second two-input NOR gate with a first input coupled to said third flip-flop output, a second input coupled to said second leading edge detector output, and an output;

a third transistor switch with a control terminal coupled to said second input signal, a first terminal coupled to a third current source and a second terminal coupled to said ground terminal;

a third charge storage element with a first terminal coupled to said third transistor switch first terminal and said first current source, and a second terminal coupled to said ground terminal;

a second three-input OR gate with a first input coupled to said buffer circuit output, a second input coupled to one output of the squelch qualification circuit, a third input coupled to said third charge storage element first terminal, and an output; and a fourth D-type flip-flop with a D input coupled to said second two-input NOR gate output, and a clear input coupled to said second three-input OR gate output, a clock input coupled to an inverse of said second input signal, and an output indicating a detection of a negative linkpulse upon assertion.

8. A differential signal receiver circuit for a squelch qualification circuit comprising:

a first leading edge detector with an input coupled to a first input signal corresponding to a positive half cycle of a differential signal, for generating at an output a positive-half pulse signal at a positive transition of said first input signal;

a second leading edge detector with an input coupled to a second input signal corresponding to a negative half cycle of said differential signal, for generating at an output a negative-half pulse signal at a positive transition of said second input signal;

logic means, having a first input coupled to said first leading edge detector output, and a second input coupled to said second leading edge detector output, for performing a logical sum of said positive-half and negative-half pulse signals to generate a sum signal at an output;

an end-of-transmission delimiter detector with an input coupled to said logic means output, for asserting a time-out signal when a predetermined time period of no transitions follows a series of transitions on said differential input signal, indicating an end of transmission; and a linkpulse detector responsive to said logic means output and said first and second leading edge detector outputs, for detecting one of a negative and a positive linkpulse signals with a predetermined duration, and asserting one of a positive and negative linkpulse detect outputs respectively.

9. A differential signal receiver circuit for a squelch qualification circuit comprising:

a first two-input terminal, with a first input for receipt of a first input signal corresponding to a positive half cycle of a differential signal, and a second input for receipt of an inverse of said first input signal;

a second two-input terminal, with a first input for receipt of a second input signal corresponding to a negative half cycle of a differential signal, and a second input for receipt of an inverse of said second input signal;

a first leading edge detector with a first one-shot circuit having a first delaying and a first gating network, said first leading edge detector having two inputs connected to said first two-input terminal for generating a positive-half pulse of controlled duration at positive transitions of said first input signal;

a second leading edge detector with a second one-shot circuit having a second delaying and a second gating network, said second leading edge detector having two inputs connected to said second two-input terminal for generating a negative-half pulse of controlled duration at positive transitions of said second input signal;

logic means, having a first input coupled to said first leading edge detector output, a second input coupled to said second leading edge detector output, and a third input coupled to a reset input signal, said logic means for performing a logical sum of said positive-half and negative-half pulse signals to generate a sum signal at an output;

an end-of-transmission delimiter detector with a first timing circuit having a first predefined timing threshold with an input for receiving said logic means output sum signal, said first timing circuit for measuring at time duration between asserted pulses of said sum signal and asserting a time-out input signal once said duration exceeds said timing threshold, indicating end of transmission;

a positive linkpulse detector responsive to said first input signal for detecting a positive linkpulse and asserting a positive linkpulse detect output;

a negative linkpulse detector responsive to said second input signal for detecting a negative linkpulse and asserting a negative linkpulse detect output;

a second timing circuit with a second predefined timing threshold having an input for receiving said logic means output sum signal, said second timing circuit for measuring a time duration between asserted pulses of said sum signal and deasserting said positive and said negative linkpulse detect outputs once said duration exceeds said timing threshold; and wherein upon detection of a positive linkpulse said positive linkpulse detector disables said negative linkpulse detector, and upon detection of a negative linkpulse said negative linkpulse detector disables said positive linkpulse detector, and upon detection of a carrier by the squelch qualification circuit, the squelch qualification circuit disables said positive and negative linkpulse detector.

10. The differential signal receiver of claim 9 wherein said first leading edge detector comprises:

a transistor switch with a control terminal coupled to said positive half cycle of said differential input signal, a first terminal coupled to a current source and a second terminal coupled to a ground terminal;

a charge storage element with a first terminal coupled to said transistor switch first terminal and said current source, and a second terminal coupled to said ground terminal;

an OR gate having a first input coupled to said storage element first terminal, said transistor switch first terminal and said current source, and a second input coupled to a reset input signal; and a D-type flip-flop with a D input coupled to a logical high, a clear input coupled to an output of said OR gate, and a clock input coupled to said positive half cycle of said differential input signal.

11. The differential signal receiver of claim 9 wherein said second leading edge detector comprises:

a transistor switch with a control terminal coupled to said negative half cycle of said differential input signal, a first terminal coupled to a current source and a second terminal coupled to a ground terminal;

a charge storage element with a first terminal coupled to said transistor switch first terminal and said current source, and a second terminal coupled to said ground terminal;

an OR gate having a first input coupled to said storage element first terminal, said transistor switch first terminal and said current source, and a second input coupled to a reset input signal; and a D-type flip-flop with a D input coupled to a logical high, a clear input coupled to an output of said Or gate, and a clock input coupled to said negative half cycle of said differential input signal.

12. The differential signal receiver of claim 9 wherein said end-of-transmission delimiter detector comprises:

a transistor switch with a control terminal coupled to said sum signal, a first terminal coupled to a current source and a second terminal coupled to a ground terminal;

a charge storage element with a first terminal coupled to said transistor switch first terminal and said current source, and a second terminal coupled to said ground terminal; and a D-type flip-flop with a D input coupled to a logical high, a clear input coupled to said sum signal, and a clock input coupled to said transistor switch first terminal and said storage element first terminal via two inverters.

13. A method for determining characteristics of an input signal to a differential receiver comprising the steps of:

detecting transitions of an input signal and generating pulses corresponding to particular transitions;

detecting a predefined pattern of said pulses representing a particular polarity of a linkpulse; and asserting a positive linkpulse detect output when a non-inverted linkpulse is detected, and disabling a negative linkpulse detect output when said positive linkpulse output is asserted; and asserting a negative linkpulse detect output when an inverted linkpulse is detected, and disabling said positive linkpulse detect output when said negative linkpulse detect output is asserted.

* * * * *